United States Patent [19]
Martin et al.

[11] Patent Number: 5,909,130
[45] Date of Patent: Jun. 1, 1999

[54] DIGITAL LOCK DETECTOR FOR PHASE-LOCKED LOOP

[75] Inventors: David G. Martin, Bethlehem; Scott Wayne McLellan, Albany Towhnship, both of Pa.

[73] Assignee: Lucent Technologies Inc., Murray Hill, N.J.

[21] Appl. No.: 08/837,244

[22] Filed: Apr. 10, 1997

Related U.S. Application Data

[60] Provisional application No. 60/016,784, Apr. 30, 1996.

[51] Int. Cl.$^6$ ........................................... H03L 7/08
[52] U.S. Cl. ............................ 327/12; 327/150; 327/159
[58] Field of Search ................................ 327/2, 3, 5, 7, 327/8, 10, 12, 147, 150, 156, 159; 331/1 A, 17, 25

[56] References Cited

U.S. PATENT DOCUMENTS

| | | | |
|---|---|---|---|
| 3,988,696 | 10/1976 | Sharpe | 331/1 A |
| 4,077,016 | 2/1978 | Sanders et al. | 331/4 |
| 4,115,745 | 9/1978 | Egan | 331/17 |
| 4,151,463 | 4/1979 | Kibler | 324/82 |
| 4,590,440 | 5/1986 | Haque et al. | 331/17 |
| 4,604,582 | 8/1986 | Strenkowski et al. | 327/147 |
| 5,302,916 | 4/1994 | Pritchett | 331/1 A |
| 5,337,022 | 8/1994 | Pritchett | 331/1 A |
| 5,406,592 | 4/1995 | Baumert | 327/159 |
| 5,483,558 | 1/1996 | Leon et al. | 375/376 |
| 5,530,383 | 6/1996 | May | 327/147 |

FOREIGN PATENT DOCUMENTS

| | | | |
|---|---|---|---|
| 0199 448 | 3/1986 | European Pat. Off. | H03L 7/08 |
| 3130156 A1 | 7/1981 | Germany | H03L 7/06 |

OTHER PUBLICATIONS

"Phase–Locked Loops, Theory, Design and Application" by Roland E. Best, (2nd Ed.), pp. 93–165, published by McGraw–Hill, Inc.

*Primary Examiner*—Tuan T. Lam
*Attorney, Agent, or Firm*—David L. Smith

[57] ABSTRACT

A phase lock detector circuit is disclosed that generates delayed versions of both a reference clock signal and a synthesized clock signal. From the delayed signals, first and second control signals that are pulses are generated. The pulses are passed through respective delays of predetermined durations and then clocked into respective shift registers by the latched signal of the opposite input. The shift register outputs are logically combined and shifted into a third shift register. Outputs from the third shift register are logically combined to ascertain whether a phase-lock loop is phase lock. The lock detector circuit may include a lock-out circuit to disable the phase lock detector circuit upon detecting phase lock.

49 Claims, 5 Drawing Sheets

NO LOCK CONDITION : ΔT < DELAY

DIGITAL LOCK DETECTOR FOR PHASE-LOCKED LOOP

This application claims benefit of Provisional Appl. 60/016,784 filed Apr. 30, 1996.

Technical Field

This invention relates generally to integrated circuits including a phase-locked loop and particularly to integrated circuits having a phase-locked loop with a digital lock detector circuit.

BACKGROUND OF THE INVENTION

Phase locked loops are well-known and widely used in synchronizing an output signal with a reference or input signal in frequency as well as phase. In the synchronized state, sometimes referred to as the locked state, the phase error between the output signal and the reference signal is zero, or at least within a small, acceptable tolerance. Principles of phase-locked loops operation as well as applications are described in Phase-Locked Loops, second ed., by R. Best published by McGraw-Hill, Inc., 1993, the disclosure of which is hereby incorporated by reference.

Phase and frequency locked loops are used concurrently in the control of an oscillator to expand a clock signal or generate a higher or lower frequency clock signal based on a reference clock signal. The phase locked loop first adjusts the frequency of operation of the oscillator as a coarse adjustment. The phase detector circuit provides a finer adjustment of the operation of the oscillator to align a characteristic feature, typically a leading rising edge, of the oscillator generated clock signal, known as a synthesized clock signal, with the same characteristics of the reference clock signal.

Typically the frequency of the synthesized clock signal will be adjusted until it is the desired multiple or fractional multiple frequency of the reference clock signal. Upon achieving the desired frequency relative to the reference clock signal, a phase-lock circuit adjusts operation of the oscillator until the instantaneous phase error between the reference clock signal and the synthesized clock signal is within a predetermined tolerance.

When a phase locked loop is initially powered-up, a finite time is required until the instantaneous phase error is within the tolerance, that is before the synthesized clock signal is stable and considered locked. The synthesized clock signal is not reliable until the lock condition occurs.

One known technique of permitting switching from a reference clock signal to a synthesized clock signal is to perform a worst-case analysis to determine the maximum time required for the synthesized clock signal to be aligned with the reference clock signal. A time delay greater than the maximum time required for alignment to occur is introduced such that the synthesized clock signal cannot be used until the delay times out. In this manner it can be assured that the synthesized clock signal cannot be utilized until it is aligned with the reference clock signal.

A shortcoming of this technique is that power is unnecessarily consumed when alignment occurs in less time than the worst case scenario but use of the synthesized clock signal is prevented due to the delay having not timed out.

What is desired is a technique that would permit using a synthesized clock signal as soon as it is aligned with a reference clock signal.

SUMMARY OF THE INVENTION

In accordance with an embodiment of the invention, an integrated circuit includes a lock detector circuit for determining when a synthesized clock signal is aligned with a reference clock signal. The lock detector circuit includes a phase detector for receiving a reference clock signal and a synthesized clock signal. The phase detector produces five signals. The five signals include a latched version of the reference clock signal, a latched version of a synthesized clock signal, first and second signals such that the difference in pulse width between the first and second signals is proportional to the phase difference between the reference clock signal and the synthesized clock signal, and a third signal that resets the first and second signals when the first and second signals are simultaneously in an active state. The third signal capable of being reset upon the first and second signals being reset. A first delay receives the first signal and provides a first delayed signal. A second delay receives a second signal and provides a second delayed signal. A first shift register receives the second delayed signal as an input and receives the latched version of the reference clock signal as a clock, the first shift register produces an output that indicates the state of the second delayed signal when the latched version of the reference clock signal transitions. A second shift register receives the first delayed signal as an input and receives the latched version of the synthesized clock signal as a clock. The second shift register produces an output that indicates the state of the first delayed signal when the latched version of the synthesized clock signal transitions. An AND gate receives the first and second shift register output and produces an output that is a combination of the input. A third shift register receives as an input the AND gate output, and receives the third signal as a clock signal. The third shift register provides an output that is at least one bit in width. A logic circuit receives the output from the third shift register and provides an output indicating phase lock between the synthesized clock signal and the reference clock signal if a predetermined number of bits of the third shift register output are in a predetermined state.

DETAILED DESCRIPTION

Figure 1:
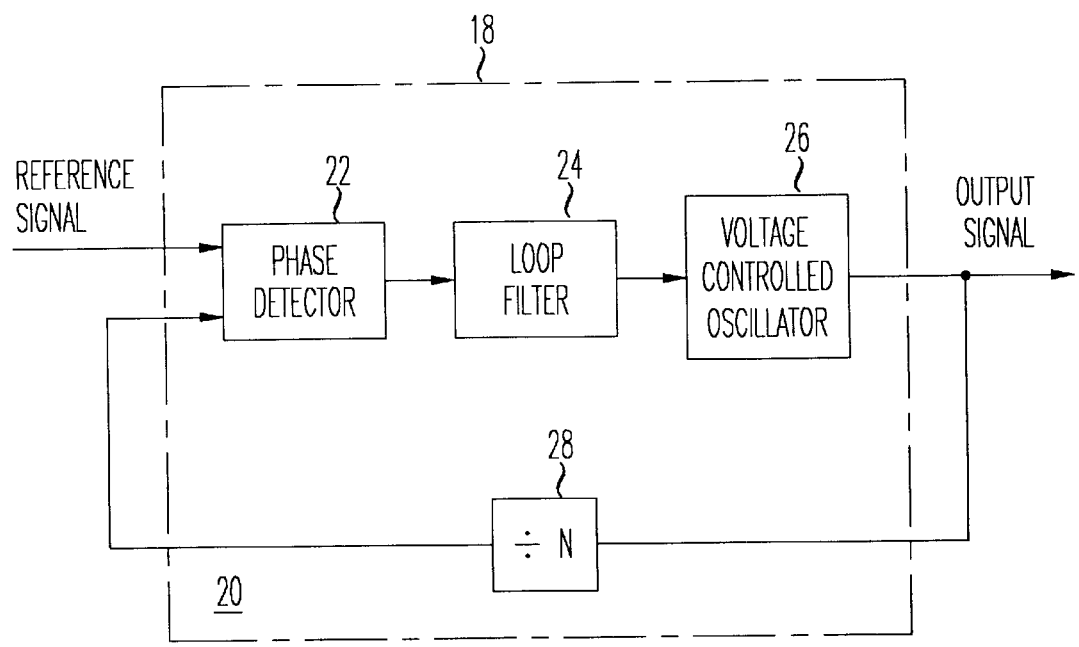
FIG. 1 is a block diagram of a phase-locked loop.

FIG. 1 shows a phase-lock loop 20, which may be part of a integrated circuit 18. Phase-locked loop 20 is comprised of a phase detector 22, a loop filter 24 and a voltage controlled oscillator 26. In some phase-locked loop circuits, a current-controlled oscillator is utilized instead of a voltage controlled oscillator. When the oscillator is current controlled, the output signal from the phase detector is a controlled current source rather than a voltage source. Phase-locked loop 20 may include a divide-by-N counter 28. The reference clock signal is coupled as one input to phase detector 22. The output of phase detector 22 provides the input to loop filter 24. The output of loop filter 24 is provided as the input to voltage controlled oscillator 26. The output of voltage controlled oscillator 26 is an output from the phase-locked loop, which may be a synthesized clock signal. The synthesized clock signal is provided as the second input to phase detector 22. When the frequency of the synthesized clock signal is greater than the frequency of the reference signal, a divide-by-N counter is provided to divide down the synthesized clock signal for comparison to the referenced signal in phase detector 22.

Figure 2:
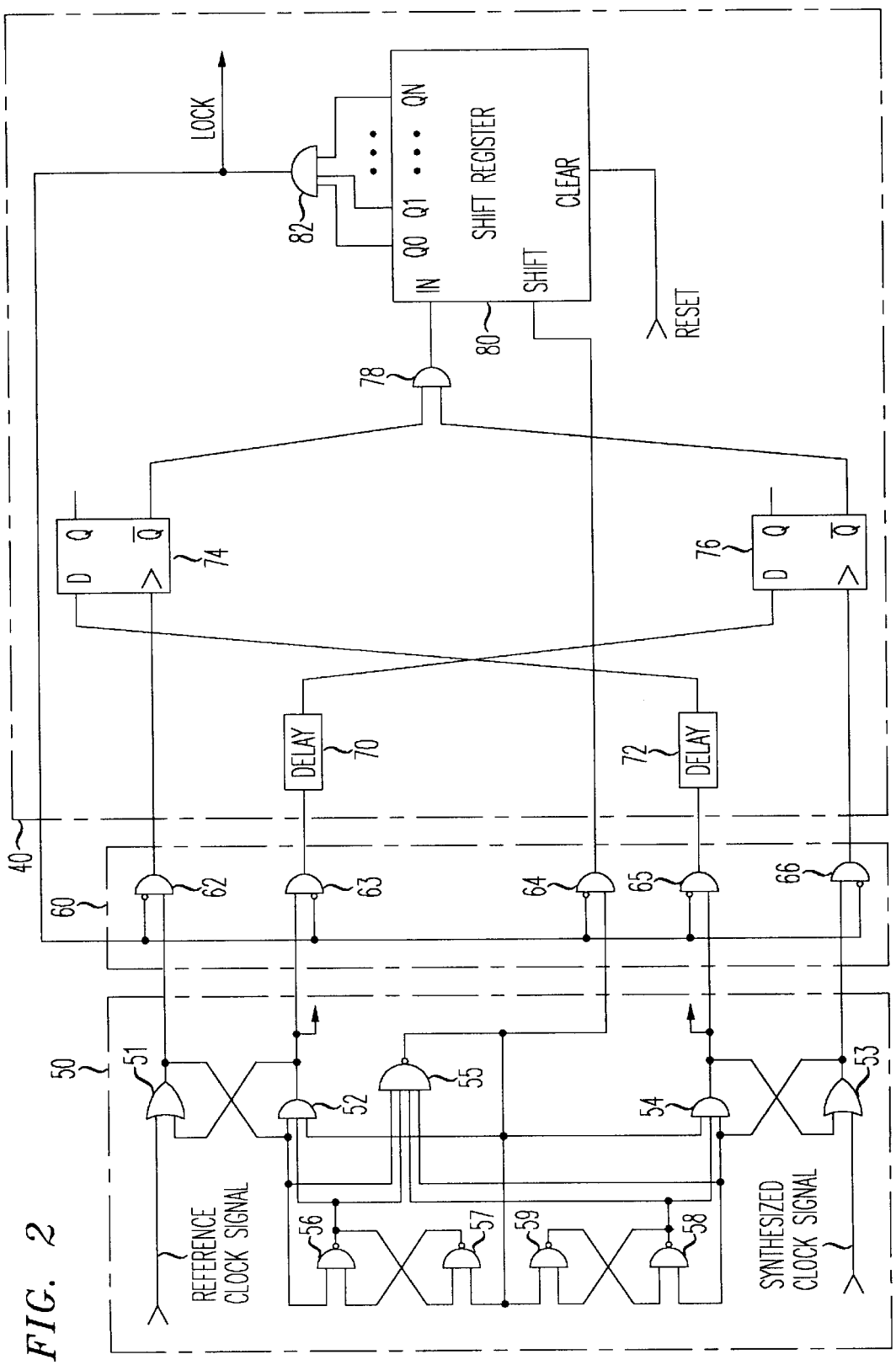
FIG. 2 is a schematic diagram illustrating an embodiment of the lock detector circuit.

FIG. 2 shows a schematic diagram of a portion of integrated circuit 18 within phase detector 22. The portion of the integrated circuit 18 shown is a lock detector circuit for indicating phase lock between a reference clock signal and a synthesized clock signal in a phase-locked loop. The lock detector circuit 40 receives signals from a phase frequency detector 50. The signals received from phase frequency detector 50 may pass through a lock-out circuit 60 prior to being received by lock detector circuit 40. Phase frequency detector 50 may be a commercial version of the type IV phase frequency detector disclosed in Phase-Locked Loops cited above.

Phase frequency detector 50 receives a reference clock signal and a synthesized clock signal. Phase frequency detector 50 generates a latched version of the reference clock signal, a latched version of the synthesized clock signal, first and second control signals, and a reset signal that resets the first and second control signals when the first and second control signals are simultaneously in the same state. The third control signal is capable of being reset upon the first and second control signals being reset. The first and second control signals are constructed such that the difference in pulse width between the first and second signals is proportional to the phase difference between the reference clock signal and the synthesized clock signal. The signals produced by phase frequency detector 50 are provided as inputs to lock detector circuit 40. The signals produced by phase frequency detector 50 may pass through lock-out circuit 60, if present.

Lock detector circuit 40 is comprised of first and second delays 70 and 72, first and second shift registers 74 and 76, AND gate 78, third shift register 80, and logic circuit 82. First delay 70 receives the first control signal from phase frequency detector 50 and introduces a predetermined first delay to the signal. A delayed first signal is provided at the output of first delay 70. Similarly, second delay 72 receives the second control signal from phase frequency detector 50 and introduces a predetermined second delay to provide at its output a delayed second signal. First shift register 74 receives as its input the delayed second signal from second delay 72 and is clocked by the latched version of the reference clock signal received from phase frequency detector 50. First shift register 74 provides a first shift register output signal at its output. Similarly, second shift register 76 receives the delayed first signal from first delay 70 as its input and receives as a clock signal the latched version of the synthesized clock signal from phase frequency detector 50. Second shift register 76 provides at its output a second shift register output signal.

The first shift register output and second shift register output are provided as inputs to AND gate 78. AND gate 78 produces an output that is a logical combination of its inputs. The output from AND gate 78 provides the input to third shift register 80. Third shift register 80 is typically a multiple bit shift register. The output from third shift register 80 is typically at least one bit and can be independently reset. The output from third shift register 80 provides the input to logic circuit 82. Logic circuit 82 provides an output indicating phase lock if a predetermined number of bits of the third shift register output are in a predetermined state. The output of logic circuit 82 indicates lock by assuming a predetermined state. When the predetermined state of the output of logic circuit 82 indicates lock, lock-out circuit 60 may be activated to prevent the inputs produced by phase frequency detector 50 from changing the state of lock detector circuit 40 output.

Lock-out circuit 60 is comprised, in the disclosed embodiment, of a plurality of AND gates with an AND gate in the path of each signal received from phase frequency detector 50. The lock signal produced by logic circuit 82 provides the second input to each AND gate in lock-out circuit 60. For example, when the output of logic circuit 82, which is the output of lock detector circuit 40, goes high to indicate a lock condition of phase-locked loop 20, with an inverted input receiving the lock signal in any of AND gates 62, 63, 64, 65 or 66, the corresponding signal received from phase frequency detector 50 is prevented from being passed on to lock detector 40. In this manner, lock-out circuit 60 prevents the five signals produced by phase-frequency detector 50 from changing the output of logic circuit 82 once a locked condition has been detected.

In operation, the reference clock signal and synthesized clock signal are received by phase frequency detector 50. It is understood that the synthesized clock signal received by phase frequency detector 50 may be a divided down version of the synthesized clock signal produced by the voltage controlled oscillator. When the phase-locked loop has achieved frequency lock but not phase lock, i.e., when the phase error is too large for the phase-locked loop to be phase locked, the reference clock signal and synthesized clock signal are at the same frequency but are out-of-phase. Thus, for each rising leading edge of the reference clock signal there will be a corresponding rising leading edge of the synthesized clock signal but a phase difference between them that is greater than the acceptable tolerance to be considered locked.

Figure 3:
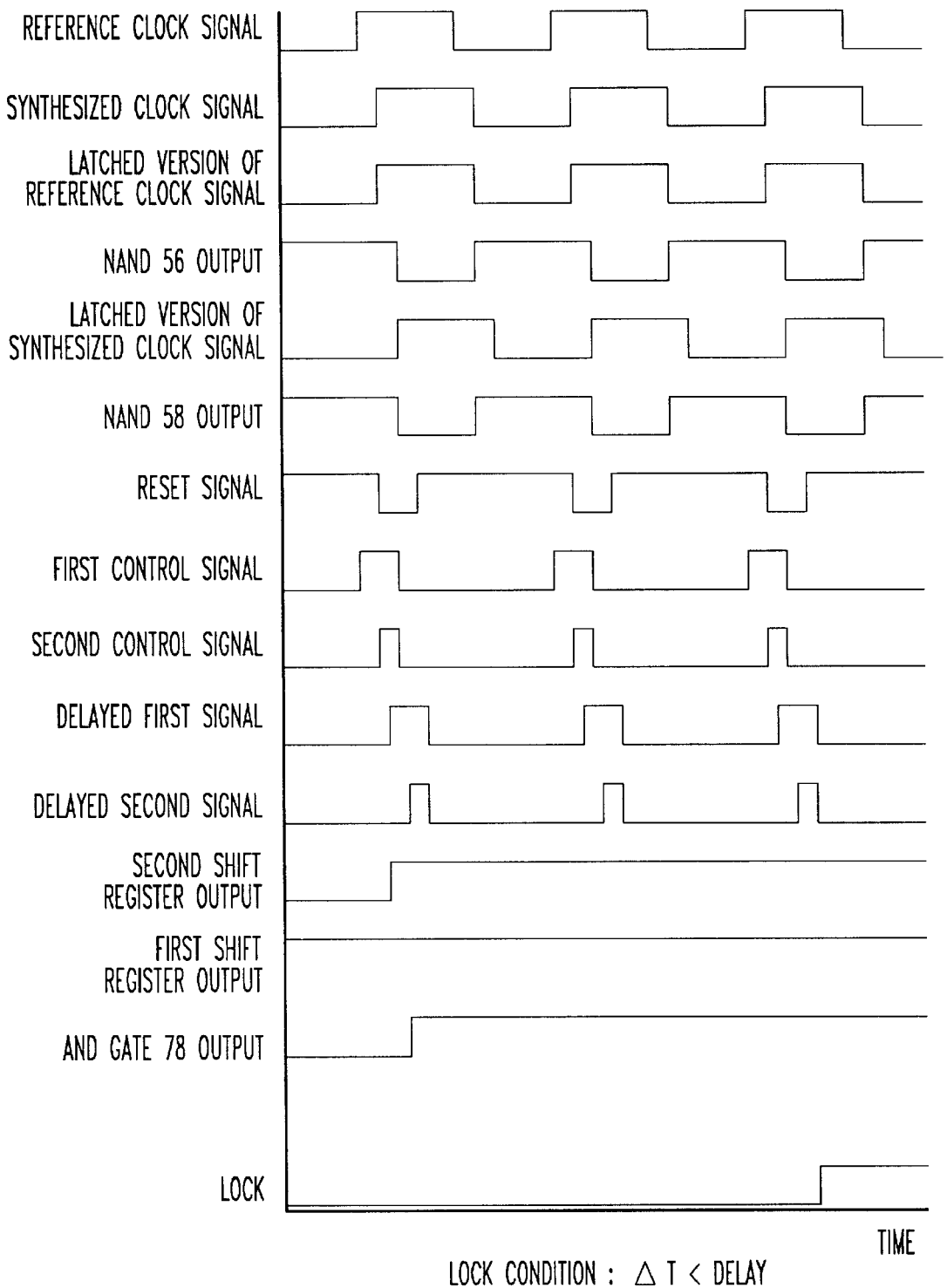
FIG. 3 is a graphical diagram showing signals from the schematic diagram of FIG. 2 in which the reference clock signal and synthesized clock signal are within the delay and therefore considered locked.

An example of operation of lock detector circuit 40 in which lock is achieved is shown in FIG. 3. The latched version of the reference clock signal is substantially a delayed version of the reference clock signal, delayed by the gate delay of OR gate 51. Similarly, the latched version of the synthesized clock signal is a delayed version of the synthesized clock signal, the delay being introduced by OR gate 53. When the latched version of the reference clocked signal transitions high, the output of AND gate 52 transitions high (and subsequently, as described below, transitions low) to create a first control signal pulse. Similarly, when the latched version of the synthesized clock signal output from OR gate 53 transitions to a logic high, (and subsequently, as described below, transitions low) the output of AND gate 54 transitions high generating a rising edge of a second controlled signal pulse. When the first control signal and the second control signal are both high, the phase frequency detector 50 AND gates 56, 57, 58 and 59 detect that both the first control signal and second control signal are high and the control signal reset signal is transitioned low to indicate that a reset condition exists. With the reset signal produced by NAND gate 55 low, both AND gate 52 and AND gate 54 transition low to reset, respectively, the first control signal and the second control signal to complete a phase comparison.

In the case where the reference clock signal leads the synthesized clock signal (indicating an increase of charge to a charge pump and that the voltage controlled oscillator 26 is running at a phase that is too low), it is desirable to advance the phase of the synthesized clock signal. The first and second control signals are passed through respective delays to produce delayed versions of both the first and second control signals. The delayed versions are respectively the delayed first signal output from first delay 70 and the delayed second signal output from second delay 72. Delays 70 and 72 introduce a time delay of user-determined duration and may be varied. The duration of each delay 70 and 72 is independent. Delays 70 and 72 may be fabricated as a series of inverters with the duration of the delay introduced being the propagation delay through the series of inverters. While the duration of delays 70 and 72 are typically identical, the invention is not limited thereto. If the duration of delays 70 and 72 are not equal, then a lock condition would be indicated by lock detector circuit 40 if the reference clock signal precedes the synthesized clock signal by the duration of delay 70. In a preferred embodiment, the duration of the delay in first delay 70 is the same as the duration of the delay in second delay 72. The delayed first and second signals are provided, respectively, as the inputs to second shift register 76 and first shift register 74. First shift register 74 is clocked by the latched version of the reference clock signal output by OR gate 51. Similarly, second shift register 76 is clocked by the latched version of the synthesized clock signal produced by OR gate 53.

When lock detector circuit 40 does not indicate a lock condition exists, the phase error between the reference clock signal and the synthesized clock signal is greater than the corresponding delay in first delay 70 or second delay 72. Thus, when the latched version of the synthesized clock signal transitions high as generated by the voltage controlled oscillator 26, or divided-by-N 28 if present, the first control signal is a pulse having a width that is greater than the second control signal which is also a pulse. When the latched version of the synthesized clock signal output from OR gate 53 transitions high, the delayed first signal output from first delay 70 has previously transitioned high even though it is delayed by first delay 70, because the phase error is sufficiently large. The delayed first signal has already transitioned high when the latched version of the synthesized clock signal generates the delayed second signal pulse and hence a logic one is shifted through second shift register 76 and is inverted to provide the second shift register output as a low. The second shift register output is low because the delayed first signal is clocked through second shift register 76 by the latched version of the synthesized clock signal produced by OR gate 53. Thus, the second shift register output is low and correspondingly the first shift register output is high because the delayed second signal is sufficiently short to cause a low signal to be clocked through first shift register 54. Because one of the first shift register output or second shift register output are low, AND gate 78 produces at its output a low signal.

The output of AND gate 78 provides the input to third shift register 80. Third shift register 80 is clocked by the control signal reset signal produced by NAND gate 55. The control signal reset signal produced by NAND gate 55 is considered the master reset which transitions high at the end of each phase comparison. The lock detector circuit 40 operates continuously, but will not indicate a locked condition until the frequency of the reference clock signal and the synthesized clock signal are substantially identical but out of phase by an amount of time less than the acceptable tolerance determined by delays 70 and 72. Under these conditions the control signals reset signal will be at the same frequency as the reference clock signal and synthesized clock signal. Thus, on every cycle of the reference clock signal the output of AND gate 78 will be clocked into third shift register 80 and each previous input to third shift register 80 will shift one stage, with the oldest being shifted out, without regard to whether or not the reference clock signal is phase-locked with the synthesized clock signal.

Logic circuit 82 represented in the illustrative embodiment as a multiple input AND gate, combines the outputs from third shift register 80 to determine whether the reference clock signal is considered phase locked with the synthesized clock signal. While logic circuit 82 being represented as an AND gate suggests for the illustrative embodiment that the output of each of the stages of the third shift register must be in the same state, such as a logic high, to indicate that the reference clock signal is phase locked with the synthesized clock signal such that the output of logic circuit 82 transitions high, the invention is not limited to requiring all of the stages of the third shift register to be in the same state. Logic circuit 82 could detect, for example, for an m stage shift register, having n of the m stages in the same state would be sufficient to indicate a lock condition. For example, having a five stage third shift register 80, if four out of five of the stages were in the same state, logic circuit 82 could indicate a phase locked condition.

Figure 4:
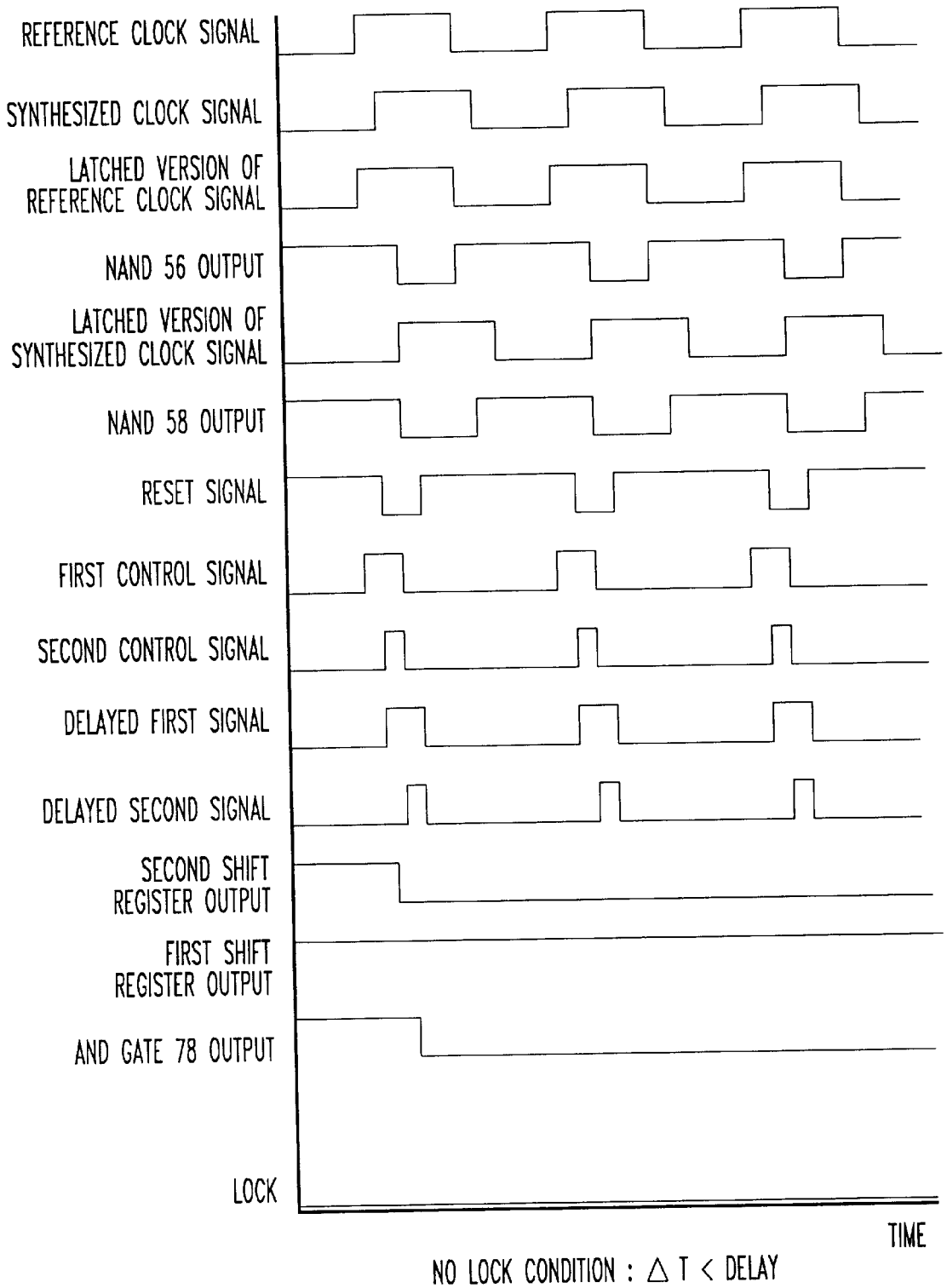
FIG. 4 is a graphical diagram showing signals from the schematic diagram of FIG. 2 in which the reference clock signal and synthesized clock signal are not within the delay and therefore lock is not detected.

Lock detector circuit 40 would indicate phase-locked loop 20 is not operating in a phase-locked condition when the characteristic feature, in the preferred embodiment the rising leading edge, of the reference clock signal is more distant from the characteristic feature of the synthesized clock signal than the corresponding delay of first delay 70 or second delay 72. Under these conditions, the latched version of the reference clock signal produced by OR gate 51 generates a first control signal pulse, which a short time later is followed by the latched version of the synthesized clock signal produced by OR gate 53 generating a rising edge on the second control signal. With both the first control signal and second control signal in the same logic state in the illustrative embodiment both being high, the control signal reset signal produced by NAND gate 55 transitions low. As best seen in FIG. 4, there is a short time period during which the delayed first signal is in a logic high state without the delayed second signal being in a logic high state. Thus, the delayed second signal pulse is much shorter than the delayed first signal pulse and when the latched version of the synthesized clock signal clocks second shift register 76 a logic high is clocked into second shift register 76. The second shift register output is a logic low with a logic high clocked into second shift register 76. Thus the output of AND gate 78 transitions low and a low state is shifted into third shift register 80. Depending upon the logical combination provided by logic circuit 82, a logic low being clocked into third shift register 80 could indicate that phase locked loop 20 is not operating in a phase locked condition.

In the above examples of operation of phase-locked loop 20, it is assumed that the first control signal and the second control signal both start off in a low state during each phase comparison. This assumption is valid since the reference clock signal and the synthesized clock signal both start off low in previous reset conditions.

The examples of operation of lock detector circuit 40 shown in FIGS. 3 and 4 illustrate the rising leading edge of the reference clock signal occurring before the rising leading edge of the synthesized clock signal. Operation of lock detector circuit 40 where the rising leading edge of the synthesized clock signal occurs before the rising leading edge of the reference clock signal is substantially the same as described above, with the order of the control signals transitioning high reversed.

Figure 5:
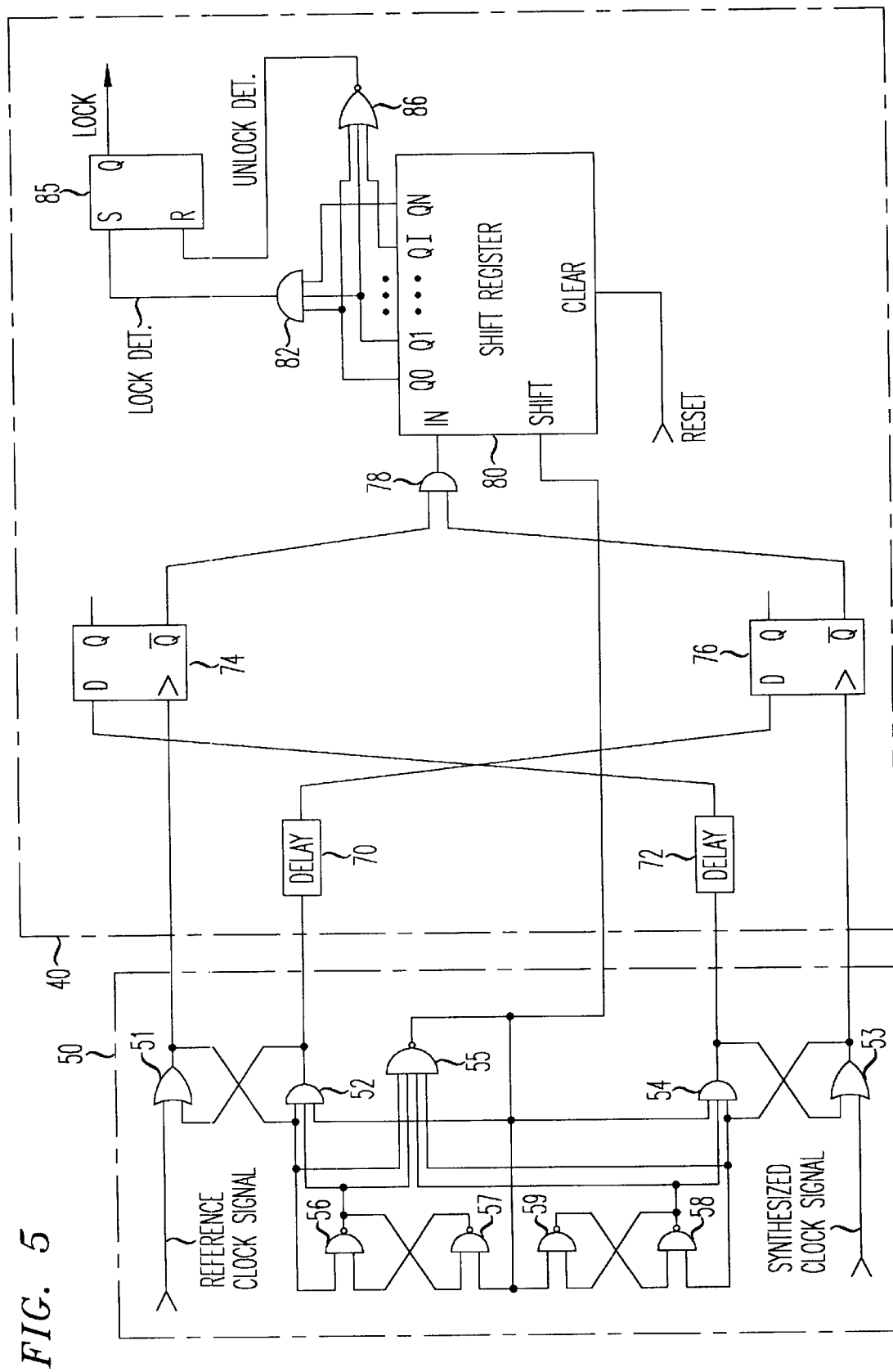
FIG. 5 is a schematic diagram illustrating an alternative embodiment of the lock detector circuit.

An exemplary embodiment for determining both lock and unlock conditions is shown in FIG. 5. This circuit is similar to that shown in FIG. 2 and as described above. However, lock-out circuit 60 is removed, permitting continuous updating of the shift register 80 with lock status information from AND gate 78, as described above. In this embodiment, the output of gate 82 (LOCK DET) indicates that the phase-locked loop 20 (FIG. 1) has achieved lock, as detected by gate 82 when there is a sufficient number of in-lock samples (indicated as logical ones in this embodiment) in the shift register 80. The LOCK DET signal is latched by set-reset latch 85, indicating that lock has been achieved. When the phase-locked loop 20 is no longer in lock or is losing lock, then the shift register is loaded with out-of-lock samples, here logical zeros. When a predetermined number of out-of-lock samples is contained in the shift register 80, the NOR gate 86 generates a signal (UNLOCK DET) that indicates that the loop is out of lock. This signal resets latch 85, removing the LOCK indication. In this embodiment, gate 82 is shown responsive to N bits in the shift register 80 and gate 86 is responsive to I bits, (I being less than or equal to N) such that the lock indication from latch 85 may exhibit hysteresis. Thus, where desirable, more sequential in-lock samples in the shift register 80 are required to indicate phase lock than sequential out-of-lock samples to clear the phase lock indication.

While the gates 82 and 86 are shown as single gates with multiple inputs (or combinations of gates designed to achieve a single logical function), the gates may be combinations of logical functions to indicate a predetermined of sample bits in the shift register 80 have the desired logical value. For example, K in-lock samples (out of N) are present, then LOCK DET may be asserted, while if J out-of-lock samples (out of I or N, J<K), then UNLOCK DET may be asserted. This approach avoids requiring N or I sequential samples to be of the same logical value for asserting LOCK DET or UNLOCK DET signals, respectively, but it complicates the logic design.

While the invention has been described as providing logic state corresponding to conditions which when combined in accordance with the illustrative embodiment produces a phase lock indication by lock detector circuit 40, it is understood that one skilled in the art could utilize different gates than are shown in the illustrative embodiment and achieve the same result. For example, rather than comparing a rising leading edge of the reference clock signal and the synthesized clock signal using rising edge triggered shift registers, one could compare falling edges of the reference clock signal and synthesized clock signal using falling edge triggered shift registers.

The invention claimed is:

1. An integrated circuit including a lock detector circuit for indicating phase lock between a reference clock signal and a synthesized clock signal, the lock detector circuit for receiving from a phase detector a version of the reference clock signal, and a version of the synthesized clock signal, first and second signals such that the difference in pulse width between the first and second signals is proportional to the phase difference between the reference clock signal and the synthesized clock signal, and a third signal that resets the first and second signals when the first and second signals are simultaneously in the same state, the lock detector circuit comprising:

a first delay having a duration, the first delay for receiving the first signal and providing a first delayed signal;

a second delay having a duration, the second delay for receiving the second signal and providing a second delayed signal;

a first shift register for receiving the second delayed signal as an input, and for receiving the version of the reference clock signal as a clock, the first shift register producing an output that indicates the state of the second delayed signal when the version of the reference clock signal transitions;

a second shift register for receiving the first delayed signal as an input, and for receiving the version of the synthesized clock signal as a clock, the second shift register producing an output that indicates the state of the first delayed signal when the version of the synthesized clock signal transitions;

a logic gate for receiving as inputs the first shift register output and the second shift register output, and for producing an output that is the combination of the inputs;

a third shift register for receiving the logic gate output as an input, and for receiving the third signal, the third shift register providing at least one bit as an output; and a logic circuit for receiving the output from the third shift register, the logic circuit providing an output indicating phase lock when a predetermined number of bits of the third shift register output are in a predetermined state.

2. An integrated circuit as recited in claim 1, wherein the duration of the first delay is not the same as the duration of the second delay.

3. An integrated circuit as recited in claim 1,
further comprising a lock-out circuit, the lock-out circuit disabling the lock detector circuit when the logic circuit output takes on the predetermined state.

4. An integrated circuit as recited in claim 1, wherein the first shift register is an edge triggerable flip-flop.

5. An integrated circuit as recited in claim 1, wherein the logic circuit is a multiple input AND gate.

6. An integrated circuit as recited in claim 1, wherein the third shift register is a multiple stage shift register.

7. An integrated circuit as recited in claim 1, wherein said first shift register output transitions from a logic low state to a logic high state to indicate the state of the second delayed signal.

8. An integrated circuit as recited in claim 1, wherein said second shift register output transitions from a logic low state to a logic high state to indicate the state of the first delayed signal.

9. An integrated circuit as recited in claim 1, wherein the first and second signals are simultaneously in a logic high state when reset.

10. An integrated circuit as recited in claim 1, wherein the third signal is for resetting the third shift register.

11. An integrated circuit as recited in claim 1, further comprising a lock-out circuit, the lock-out circuit coupled between the phase detector and the lock detector circuit for preventing the outputs of the phase detector from propagating when the logic circuit indicates lock.

12. An integrated circuit as recited in claim 1, wherein the logic circuit additionally provides an output indicating loss of phase lock when a predetermined number of bits of the third shift register output are in a state opposite the predetermined state.

13. An integrated circuit as recited in claim 12, further comprising a latch circuit, responsive to the logic circuit, for latching the phase lock and loss of phase lock outputs therefrom.

14. An integrated circuit as recited in claim 13, wherein the logic circuit includes an AND gate for providing the phase lock indication, and a NOR gate for providing the loss of phase lock indication.

15. An integrated circuit as recited in claim 14, wherein the latch circuit is a set-reset latch.

16. An integrated circuit as recited in claim 1, wherein the logic gate is an AND gate.

17. An integrated circuit including a lock detector circuit for indicating phase lock between a reference clock signal and a synthesized clock signal, the lock detector circuit comprising:
   a phase detector for receiving a reference clock signal and a synthesized clock signal, and for producing a version of the reference clock signal, and for producing a version of the synthesized clock signal, first and second signals such that the difference in pulse width between the first and second signals is proportional to the phase difference between the reference clock signal and the synthesized clock signal, and a third signal that resets the first and second signals when the first and second signals are simultaneously in the same state;
   a first delay having a duration, the first delay for receiving the first signal and providing a first delayed signal;
   a second delay having a duration, the second delay for receiving the second signal and providing a second delayed signal;
   a first shift register for receiving the second delayed signal as an input, and for receiving the version of the reference clock signal as a clock, the first shift register producing an output that indicates the state of the second delayed signal when the version of the reference clock signal transitions;
   a second shift register for receiving the first delayed signal as an input, and for receiving the version of the synthesized clock signal as a clock, the second shift register producing an output that indicates the state of the first delayed signal when the version of the synthesized clock signal transitions;
   a logic gate for receiving as inputs the first shift register output and the second shift register output, and for producing an output that is the combination of the inputs;
   a third shift register for receiving the logic gate output as an input, and for receiving the third signal, the third shift register providing at least one bit as an output; and
   a logic circuit for receiving the output from the third shift register, the logic circuit providing an output indicating phase lock when a predetermined number of bits of the third shift register output are in a predetermined state.

18. An integrated circuit as recited in claim 17, wherein the duration of the first delay is not the same as the duration of the second delay.

19. An integrated circuit as recited in claim 17, further comprising a lock-out circuit, the lock-out circuit disabling the lock detector circuit when logic circuit output takes on the predetermined state.

20. An integrated circuit as recited in claim 17, wherein the first shift register is an edge triggerable flip flop.

21. An integrated circuit as recited in claim 17, wherein the logic circuit is a multiple input AND gate.

22. An integrated circuit as recited in claim 17, wherein the third shift register is a multiple stage shift register.

23. An integrated circuit as recited in claim 17, wherein said first shift register output transitions from a logic low state to a logic high state to indicate the state of the second delayed signal.

24. An integrated circuit as recited in claim 17, wherein said second shift register output transitions from a logic low state to a logic high state to indicate the state of the first delayed signal.

25. An integrated circuit as recited in claim 23, wherein the first and second signals are simultaneously in a logic high state when reset.

26. An integrated circuit as recited in claim 23, wherein the third signal is for resetting the third shift register.

27. An integrated circuit as recited in claim 23, further comprising a lock-out circuit coupled to the lock detector circuit, the lock-out circuit for preventing outputs of the phase detector from propagating when the logic circuit indicates phase lock.

28. In an integrated circuit as recited in claim 17, wherein the logic circuit additionally provides an output indicating loss of phase lock when a predetermined number of bits of the third shift register output are in a state opposite the predetermined state.

29. In an integrated circuit as recited in claim 28, further comprising a latch circuit, responsive to the logic circuit, for latching the phase lock and loss of phase lock outputs therefrom.

30. In an integrated circuit as recited in claim 29, wherein the logic circuit includes an AND gate for providing the phase lock indication, and a NOR gate for providing the loss of phase lock indication.

31. In an integrated circuit as recited in claim 30, wherein the latch circuit is a set-reset latch.

32. An integrated circuit as recited in claim 17, wherein the logic gate is an AND gate.

33. A phase-locked loop, comprising:
   a controlled oscillator for receiving as an input a control signal and for producing a synthesized clock signal as an output;
   a loop filter for receiving a phase difference signal as an input and providing as an output the control signal input to the controlled oscillator; and
   a phase detector coupled for receiving a reference signal and the synthesized clock signal as inputs, the phase detector producing as an output the phase difference signal input to the loop filter; a lock detector circuit for indicating phase lock between the reference clock signal and the synthesized clock signal, the lock detector receiving from the phase detector a latched version of the reference clock signal, and a latched version of the synthesized clock signal, first and second signals such that the difference in pulse width between the first and second signals is proportional to the phase difference between the reference clock signal and the synthesized clock signal, and a third signal that resets the first and second signals when the first and second signals are simultaneously in the same state, the lock detector circuit comprising:
      a first delay having a duration, the first delay for receiving the first signal and providing a first delayed signal;
      a second delay having a duration, the second delay for receiving the second signal and providing a second delayed signal;
      a first shift register for receiving the second delayed signal as an input, and for receiving the latched version of the reference clock signal as a clock, the first shift register producing an output that indicates the state of the second delayed signal when the latched version of the reference clock signal transitions;
      a second shift register for receiving the first delayed signal as an input, and for receiving the latched version of the synthesized clock signal as a clock, the second shift register producing an output that indicates the state of the first delayed signal when the latched version of the synthesized clock signal transitions;

a logic gate for receiving as inputs the first shift register output and the second shift register output, and for producing an output that is the combination of the inputs;

a third shift register for receiving the logic gate output as an input, and for receiving the third signal, the third shift register providing at least one bit as an output; and a logic circuit for receiving the output from the third shift register, the logic circuit providing an output indicating phase lock when a predetermined number of bits of the third shift register output are in a predetermined state.

34. A phase-lock loop as recited in claim 33, further comprising a lock-out circuit, the lock-out circuit disabling the lock detector circuit when logic circuit output takes on the predetermined state.

35. A phase-lock loop as recited in claim 33, wherein the first shift register is an edge triggerable flip-flop.

36. A phase-lock loop as recited in claim 33, wherein the logic circuit is a multiple input AND gate.

37. A phase-lock loop as recited in claim 33, wherein the third shift register is a multiple stage shift register.

38. A phase-lock loop recited in claim 33, wherein said first shift register output transitions from a logic low state to a logic high state to indicate the state of the second delayed signal.

39. A phase-lock loop as recited in claim 33, wherein said second shift register output transitions from a logic low state to a logic high state to indicate the state of the first delayed signal.

40. A phase-lock loop as recited in claim 33, wherein the first and second signals are simultaneously in a logic high state when reset.

41. A phase-lock loop as recited in claim 33, wherein the third signal is for resetting the third shift register.

42. A phase-lock loop as recited in claim 33, further comprising a lock-out circuit, the lock-out circuit for preventing outputs of the phase detector from propagating when the logic circuit indicates phase lock.

43. An integrated circuit as recited in claim 33, wherein the logic gate is an AND gate.

44. An integrated circuit including a lock detector circuit for indicating phase lock between a reference clock signal and a synthesized clock signal, the lock detector circuit, for receiving a version of the reference clock signal, and a version of the synthesized clock signal, first and second signals such that the difference in pulse width between the first and second signals is proportional to the phase difference between the reference clock signal and the synthesized clock signal, and a third signal that resets the first and second signals when the first and second signals are simultaneously in the same state, the lock detector circuit comprising:

a first delay having a duration, the first delay for receiving the first signal and providing a first delayed signal;

a second delay having a duration, the second delay for receiving the second signal and providing a second delayed signal;

a first shift register for receiving the second delayed signal as an input, and for receiving the version of the reference clock signal as a clock, the first shift register producing an output that indicates the state of the second delayed signal when the version of the reference clock signal transitions;

a second shift register for receiving the first delayed signal as an input, and for receiving the version of the synthesized clock signal as a clock, the second shift register output producing an output that indicates the state of the first delayed signal when the version of the synthesized clock signal transitions; and a logic circuit for receiving as inputs the first shift register output and the second shift register output, and for producing an output that is indicative of whether phase lock has occurred.

45. A phase-locked loop having a lock detector, the lock detector comprising:

a circuit for providing an output signal indicating when a reference clock signal and a synthesized clock signal are within a predetermined phase difference;

a shift register having multiple outputs and responsive to the circuit, for shifting the output signal of the circuit in response to a shift signal;

a first logic circuit providing an output indicating phase lock of the reference and synthesized clock signals when a first number of the shift register outputs are of a first state; and a second logic circuit providing an output indicating a loss of lock of the reference and synthesized clock signals when a second number of the shift register outputs are of a second state.

46. The phase-locked loop as recited in claim 45, wherein the outputs of the first and second logic circuits are latched.

47. The phase-locked loop as recited in claim 46, wherein the outputs of first and second logic circuits are latched by a set-reset flipflop.

48. The phase-lock loop as recited in claim 45, wherein the first number is greater than the second number.

49. The phase-locked loop as recited in claim 48, wherein the first and second numbers are predetermined.

* * * * *